(12) United States Patent
Hashimoto et al.

(10) Patent No.: US 9,214,916 B2
(45) Date of Patent: Dec. 15, 2015

(54) ACOUSTIC PROCESSING DEVICE

(75) Inventors: Takeshi Hashimoto, Motomiya (JP); Toru Hikichi, Koriyama (JP)

(73) Assignee: CLARION CO., LTD., Saitama-Shi (JP)

( * ) Notice: Subject to any disclaimer, the term of this patent is extended or adjusted under 35 U.S.C. 154(b) by 566 days.

(21) Appl. No.: 12/995,187

(22) PCT Filed: Jul. 8, 2009

(86) PCT No.: PCT/JP2009/062466
§ 371 (c)(1),
(2), (4) Date: Nov. 30, 2010

(87) PCT Pub. No.: WO2010/005033
PCT Pub. Date: Jan. 14, 2010

(65) Prior Publication Data
US 2011/0081029 A1 Apr. 7, 2011

(30) Foreign Application Priority Data
Jul. 11, 2008 (JP) .................... 2008-180901

(51) Int. Cl.
*H03G 3/00* (2006.01)
*H03G 9/02* (2006.01)
(Continued)

(52) U.S. Cl.
CPC .............. *H03G 9/025* (2013.01); *H04R 3/04* (2013.01); *H04R 5/04* (2013.01); *H04R 2499/13* (2013.01)

(58) Field of Classification Search
CPC ........ H03G 3/001; H03G 3/32; H03G 3/3005
USPC ................ 381/102–109, 55–59, 95–98
See application file for complete search history.

(56) References Cited

U.S. PATENT DOCUMENTS

| 6,965,676 B1 | 11/2005 | Allred |
| 7,058,188 B1 | 6/2006 | Allred |
| 8,059,833 B2 * | 11/2011 | Koh et al. .................. 381/98 |

(Continued)

FOREIGN PATENT DOCUMENTS

| CN | 1798452 | 7/2006 |
| CN | 101048935 | 10/2007 |

(Continued)

OTHER PUBLICATIONS

Chinese Office Action for corresponding CN Application No. 200980124605.9, Feb. 6, 2013.

(Continued)

*Primary Examiner* — Lun-See Lao
(74) *Attorney, Agent, or Firm* — Mori & Ward, LLP

(57) ABSTRACT

There is provided an acoustic processing device capable of applying acoustic processing matching listener's sense to reproduce an audio signal with satisfactory sound quality in terms of auditory sense irrespective of the characteristics of a sound source. The acoustic processing device (1) includes a gain calculation section (5) that calculates a gain correction amount corresponding to predetermined auditory sense characteristics, an offset gain calculation section (6) that calculates a gain offset based on a frequency characteristics of an audio signal analyzed by a frequency analysis section (3), an acoustic signal generation section (7) that generates an acoustic signal based on the gain correction amount and the gain offset, and an acoustic addition section (8) that adds the generated acoustic signal to the audio signal.

10 Claims, 13 Drawing Sheets

(51) Int. Cl.
 *H04R 3/04* (2006.01)
 *H04R 5/04* (2006.01)

(56) References Cited

U.S. PATENT DOCUMENTS

| | | | |
|---|---|---|---|
| 8,094,826 B2 * | 1/2012 | Pedersen | 381/58 |
| 2004/0213420 A1 | 10/2004 | Gundry et al. | |
| 2005/0078838 A1 * | 4/2005 | Simon | 381/98 |
| 2006/0140418 A1 | 6/2006 | Koh et al. | |
| 2007/0291959 A1 | 12/2007 | Seefeldt | |
| 2008/0075303 A1 * | 3/2008 | Kim et al. | 381/103 |
| 2009/0080675 A1 * | 3/2009 | Smirnov et al. | 381/98 |

FOREIGN PATENT DOCUMENTS

| | | | |
|---|---|---|---|
| EP | 0740410 | 10/1996 | |
| JP | 7-122953 | 5/1995 | |
| JP | 2000-197182 | 7/2000 | |
| JP | 2002-084154 | 3/2002 | |
| JP | 2006-020231 | 1/2006 | |
| JP | 2006-524968 | 11/2006 | |
| JP | 2006-333396 | * 12/2006 | H04R 3/00 |
| JP | 2008-518565 | 5/2008 | |
| JP | 2009-111538 | 5/2009 | |
| WO | WO 2006/047600 | 5/2006 | |

OTHER PUBLICATIONS

Supplementary European Search Report for corresponding EP Application No. 09794477, Apr. 11, 2011.
International Search Report for International Application No. PCT/JP2009/062466, Sep. 15, 2009.
Chinese Office Action for corresponding CN Application No. 200980124605.9, Oct. 29, 2013.
European Office Action for corresponding EP Application No. 09 794 477.1-1805, Apr. 24, 2014.
Chinese Office Action for corresponding CN Application No. 200980124605.9, Jun. 23, 2014.

* cited by examiner

|  | FREQUENCY GRADIENT | MAXIMUM LOW-FREQUENCY LEVEL VALUE [dB] | INTERCEPTION VALUE [dB] | DIFFERENCE (MAXIMUM LOW-FREQUENCY LEVEL VALUE − INTERCEPTION VALUE) [dB] |
|---|---|---|---|---|
| FIG.3(a) | −0.41 | −11 | −22 | 11 (−11−(−22)) |
| FIG.3(b) | −0.31 | −1 | −37 | 36 (−1−(−37)) |
| FIG.4(a) | −0.41 | −14 | −30 | 16 (−14−(−30)) |
| FIG.4(b) | −0.09 | −17 | −31 | 14 (−17−(−31)) |

FIG.5

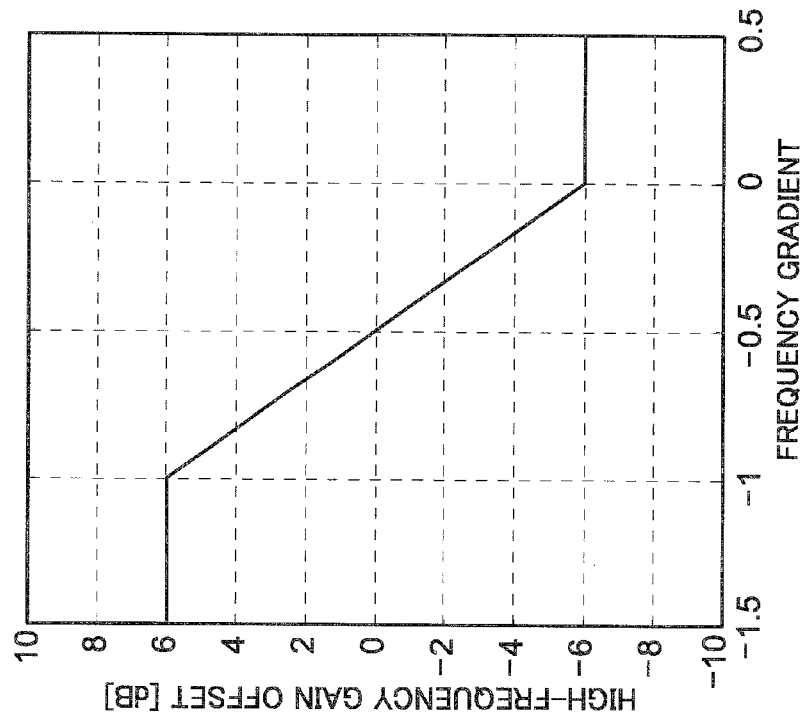
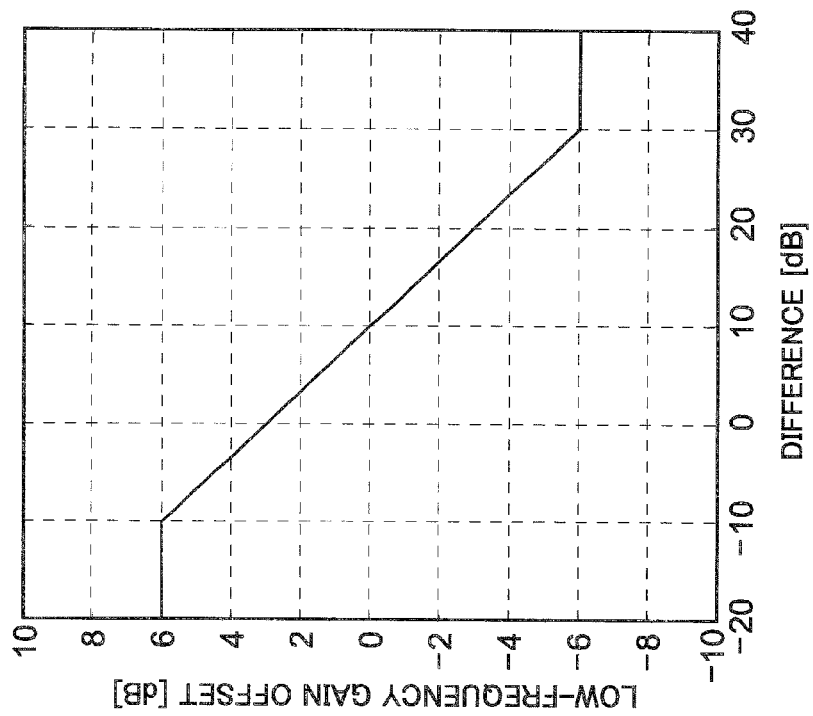
FIG. 7(a)
FIG. 7(b)

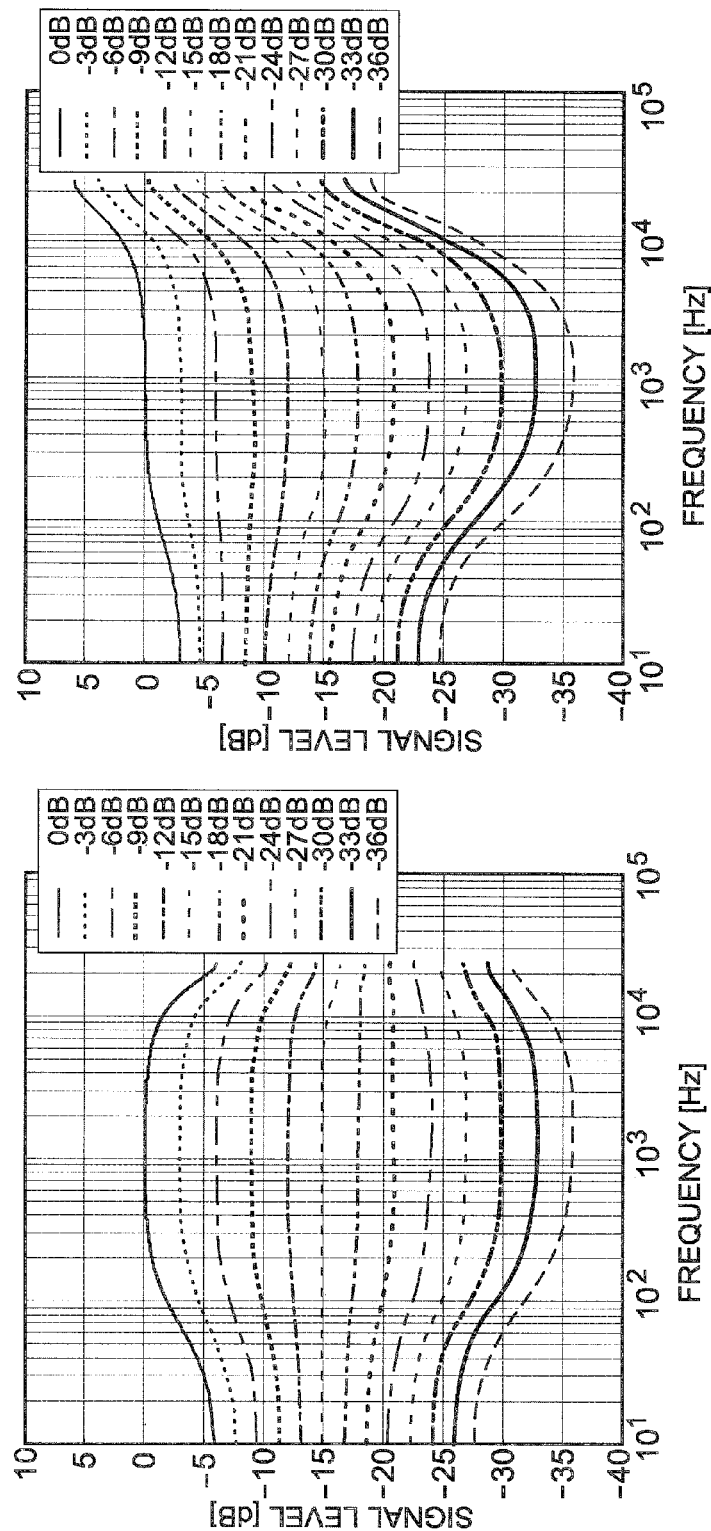

ACOUSTIC PROCESSING DEVICE

TECHNICAL FIELD

The present invention relates to an acoustic processing device and, more particularly, to an acoustic processing device capable of applying acoustic processing to an audio signal according to a gain correction amount based on auditory sense characteristics and a gain offset based on frequency characteristics of an audio signal.

BACKGROUND ART

There is conventionally known a loudness controller as a device for correcting auditory sensitivity with respect to sound volume (refer to, e.g., Patent Document 1). The loudness controller divides the frequency band of an audio signal into three ranges: low, middle, and high frequency ranges, then changes the gains of the low, middle, and high frequency ranges in conjunction with the main volume, and synthesizes the audio signals of the respective frequency ranges to achieve correction of the auditory sensitivity. The loudness characteristics are thus realized by changing the volumes of the respective frequency bands track in conjunction with the entire volume change. That is, by making sound quality, balance control, fader control, etc., in conjunction with the entire volume change, optimum acoustic environment can be achieved. In particular, auditory sensitivity correction taking into account also a special reproduction condition required for an on-vehicle application or the like can be achieved.

CITATION LIST

Patent Literature

Patent Literature 1: JP-A-2000-197182 (pages 4 and 5, FIG. 1)

SUMMARY OF INVENTION

Technical Problem

However, music includes various categories, such as classical music, pop music, and rock music, and low-frequency level or high-frequency level in an audio signal (sound source) is previously enhanced depending on the category. When the loudness correction is applied to an audio signal in which the level of a predetermined frequency band is previously enhanced, the low-frequency range or high-frequency range may possibly be excessively enhanced.

In the case where a listener listens to the audio signal in which the low-frequency range or high-frequency range is excessively enhanced, music may become hard to listen to in terms of auditory sense. Further, distortion sound may be generated from a speaker to cause degradation in the sound quality.

Further, the auditory sensitivity changes with age and, especially in an aged person, the dynamic range in the high-frequency range tends to be narrowed. Thus, in the case where the level of the low-frequency range or high-frequency range is high, music may give the aged person uncomfortable feeling. Further, in the case where the level of the low-frequency range or high-frequency range is low, music may become hard to listen to.

The present invention has been made in view of the above problems, and an object thereof is to provide an acoustic processing device capable of applying acoustic processing matching listener's sense to reproduce an audio signal with satisfactory sound quality in terms of auditory sense irrespective of the characteristics of a sound source.

Solution to Problem

To solve the above problem, according to the present invention, there is provided an acoustic processing device includes: a gain calculation section that calculates a gain correction amount corresponding to predetermined auditory sense characteristics based on a signal level of an audio signal; a frequency analysis section that analyzes a frequency of the audio signal; an offset gain calculation section that calculates a gain offset for the audio signal based on the frequency characteristics of the audio signal analyzed by the frequency analysis section; an acoustic signal generation section that generates an acoustic signal to be added to the audio signal based on the gain correction amount calculated by the gain calculation section and gain offset calculated by the offset gain calculation section; and an acoustic addition section that adds the acoustic signal generated by the acoustic signal generation section to the audio signal.

According to the acoustic processing device of the present invention, acoustic processing can be applied to an audio signal based on the gain offset calculated based on the frequency characteristics of the audio signal and gain correction amount calculated in accordance with auditory sense characteristics. Thus, it is possible to perform optimum acoustic processing corresponding to the frequency characteristics of the audio signal, as well as, to perform acoustic processing for the audio signal so as to allow the audio signal to be reproduced with satisfactory sound quality in terms of auditory sense.

Further, in the acoustic processing device, wherein the gain calculation section may divide the frequency of the audio signal into a plurality of frequency bands and calculates the gain correction amount for each of the frequency bands, the offset gain calculation section may calculate the gain offset for each of the frequency bands obtained by the frequency division in the gain calculation section, the acoustic signal generation section may generate the acoustic signal to be added to the audio signal for each of the frequency bands based on the frequency-based gain correction amount calculated by the gain calculation section and frequency-based gain offset calculated by the offset gain calculation section, and the acoustic addition section may add the frequency-based acoustic signal generated by the acoustic signal generation section to the audio signal of the corresponding frequency.

As described above, the acoustic signal generation section applies acoustic processing to the audio signal for each of the obtained frequency bands based on the gain correction amount calculated for each of the frequency bands and gain offset corresponding to the gain correction amount. As a result, even in the case where the level of a signal of a specified frequency band has been enhanced or reduced, the acoustic processing can be applied for each relevant frequency band.

For example, there may be a case where the high-frequency range or low-frequency range of an audio signal is previously enhanced depending on the category of a sound source. When the loudness correction is applied to the high-frequency or low-frequency range in such a situation, output sound may be distorted, sound quality may be degraded, or sound may become hard to listen to in terms of auditory sense. In such a case, by reducing the volume, etc. not in the entire frequency range but in the relevant high-frequency range or low-frequency range, the entire acoustic characteristics can be improved.

Further, in the acoustic processing device, wherein the frequency analysis section may calculate a signal level state for each of the frequency bands obtained by the frequency division based on a change in the signal level in the frequency range of the audio signal, and the offset gain calculation section may calculate the gain offset of the audio signal for each of the frequency bands based on the frequency-based signal level state calculated by the frequency analysis section.

As described above, the offset gain calculation section calculates the gain offset for each of the frequency bands based on the signal level state calculated for each of the frequency bands by the frequency analysis section. As a result, acoustic processing corresponding to the frequency characteristics of the audio signal can be applied to the audio signal for each of the frequency bands.

For example, the frequency analysis section determines the low-frequency signal level based on the signal level state relative to the signal level in all the frequencies to thereby determine, e.g., a state where only the low-frequency range is excessively enhanced relative to all the frequency ranges. By calculating the gain offset in accordance with the frequency-based signal level state, a local increase or decrease in the signal level can be corrected.

Further, in the acoustic processing device, wherein in the case where the frequency analysis section determines that the signal level of the audio signal in a predetermined frequency range is higher relative to all the frequencies of the audio signal, the offset gain calculation section may calculate a gain offset capable of reducing the signal level in the predetermined frequency range.

As described above, when performing acoustic processing in accordance with the frequency characteristics of the audio signal, the offset gain calculation section calculates the gain offset capable of reducing the signal level in the frequency band in which the signal level is higher relative to that in all the frequencies. That is, based on the calculated gain offset, the signal level in the locally enhanced frequency band in an audio signal can be reduced. Further, correction processing that balances the entire audio signal can be realized. In particular, it is often the case that the low-frequency range or high-frequency range of an audio signal is enhanced depending on the category of music. Thus, in the case where the low-frequency range or high-frequency range is excessively enhanced, only the enhanced portion is reduced to thereby optimize the entire audio signal.

Further, in the acoustic processing device, wherein in the case where the frequency analysis section determines that the signal level of the audio signal in a predetermined frequency range is lower relative to all the frequencies of the audio signal, the offset gain calculation section may calculate a gain offset capable of increasing the signal level in the predetermined frequency range.

As described above, when performing acoustic processing in accordance with the frequency characteristics of the audio signal, the offset gain calculation section calculates the gain offset capable of increasing the signal level in the frequency band in which the signal level is lower relative to that in all the frequencies. That is, based on the calculated gain offset, the signal level in the locally reduced frequency band in an audio signal can be increased. Thus, correction processing that balances the entire audio signal can be realized.

Further, in the acoustic processing device, wherein in the case where the signal level of the audio signal is high, the gain calculation section may calculate the gain correction amount capable of reducing the signal level of the audio signal, and in the case where the signal level of the audio signal is low, the gain calculation section may calculate the gain correction amount capable of increasing the signal level of the audio signal.

As described above, the gain calculation section calculates the gain correction amount corresponding to predetermined auditory sense characteristics based on the signal level of an audio signal. In the case where the signal level of the audio signal is high, the gain calculation section calculates the gain correction amount so as to reduce the signal level of the audio signal. As a result, even in the case where the gain of the audio signal has been enhanced to such a degree that the sound based on the audio signal gives uncomfortable feeling to a listener in terms of auditory sense, the gain can effectively be reduced, thereby obtaining an optimum level in terms of auditory sense.

In the case where the signal level of the audio signal is low, the gain calculation section calculates the gain correction amount so as to increase the signal level of the audio signal. As a result, even in the case where the gain of the audio signal has been reduced to such a degree that the sound based on the audio signal becomes hard to listen to, the gain can effectively be increased, thereby obtaining an optimum level in terms of auditory sense.

Further, in the acoustic processing device, wherein the gain calculation section may have a plurality of correction amount calculation filters for use in the calculation of the gain correction amount and calculate the correction amount based on one of the plurality of correction amount calculation filters selected by a listener.

As described above, the gain calculation section calculates the gain correction amount corresponding to predetermined auditory sense characteristics based on the signal level of an audio signal. However, auditory taste may differ for each listener. Therefore, a plurality of correction amount calculation filters are prepared in the gain calculation section, and a correction amount calculation filter to be used for the calculation of the correction amount is determined according to a listener's selection. As a result, acoustic processing corresponding to the taste of each listener can be applied to the audio signal.

Further, in the acoustic processing device, wherein the plurality of correction amount calculation filters may include a plurality of calculation filters in which an audible signal level is changed in a stepwise manner in consideration of the audibility of a listener that diminishes with age.

As described above, the plurality of correction amount calculation filters in which audible signal level is changed in a stepwise manner are provided in consideration of the audibility of a listener that diminishes with age. As a result, acoustic processing in correspondence with the audibility differing with age can be performed. Further, the audio signal giving uncomfortable feeling to a listener or audio signal that is hard to listen to can be corrected to satisfactory sound quality for the listener.

Advantageous Effects of Invention

According to the acoustic processing device of the present invention, acoustic processing can be applied to an audio signal based on the gain offset calculated based on the frequency characteristics of the audio signal and gain correction amount calculated in accordance with auditory sense characteristics. Thus, optimum acoustic processing corresponding to the frequency characteristics of the audio signal can be performed, as well as, acoustic processing for the audio signal

BRIEF DESCRIPTION OF THE DRAWINGS

FIG. 3 is a view illustrating a signal that has been subjected to averaging processing and decibel conversion by an FFT processing section in a frequency analysis section according to the present embodiment, a maximum value hold signal, and a primary regression analysis calculated based on the maximum value hold signal, in which FIG. 3(a) illustrates a state of a sound source whose low-frequency signal level is low; and FIG. 3(b) illustrates a state of a sound source whose low-frequency signal level is high.

FIG. 4 is a view illustrating a signal that has been subjected to averaging processing and decibel conversion by an FFT processing section in a frequency analysis section according to the present embodiment, a maximum value hold signal, and a primary regression analysis calculated based on the maximum value hold signal, in which FIG. 4(a) illustrates a state of a sound source whose high-frequency signal level is low; and FIG. 4(b) illustrates a state of a sound source whose high-frequency signal level is high.

FIG. 5 is a table illustrating the frequency gradient, maximum low-frequency level value, intercept value, and difference which are calculated from the graphs of FIGS. 3(a), 3(b), 4(a), and 4(b) in a comparative manner.

FIG. 7(a) is a view illustrating the low-frequency gain offset set based on the difference in the low-frequency offset gain calculation section of the offset gain calculation section according to the present embodiment; and FIG. 7(b) is a view illustrating the high-frequency gain offset set based on the frequency gradient in the high-frequency offset gain calculation section of the offset gain calculation section according to the present embodiment.

FIG. 13 is a view illustrating the characteristics of the loudness filter section according to the present embodiment in accordance with the gain offset set in the offset gain calculation section and filter type used in the gain calculation section.

DESCRIPTION OF EMBODIMENTS

An acoustic processing device according to the present invention will be described in detail with reference to the drawings.

An audio device adopting the configuration of an acoustic processing device according to the present invention may be a home-use audio device or a potable type audio device. Preferably, the audio device is applied to an on-vehicle audio device.

Inside a vehicle, various types of noise, such as driving noise and traveling noise, are generated. An on-vehicle audio device reproduces music under such an environment and often has an equalizing function, etc. for enhancing the level of the low-frequency or high-frequency range so as to prevent music to be listened to from being affected by noise. Since the vehicle interior is a closed space, the enhancement of low-frequency level or high-frequency level in an audio signal allows music sense of reality to be enhanced.

However, there may be a case where the low-frequency level or high-frequency level in an audio signal is previously enhanced depending on the music category. Thus, when the equalizing function or the like is applied to the audio signal in which the low-frequency level or high-frequency level in an audio signal is previously enhanced, the low-frequency range or high-frequency range may further be enhanced. By applying an acoustic processing device according to the present invention to the on-vehicle audio device, it is possible to prevent the gains of the enhanced low frequency range or high frequency range from being further enhanced to allow reproduction of an audio signal with satisfactory sound quality in terms of auditory sense irrespective of the characteristics of a sound source.

Figure 1:
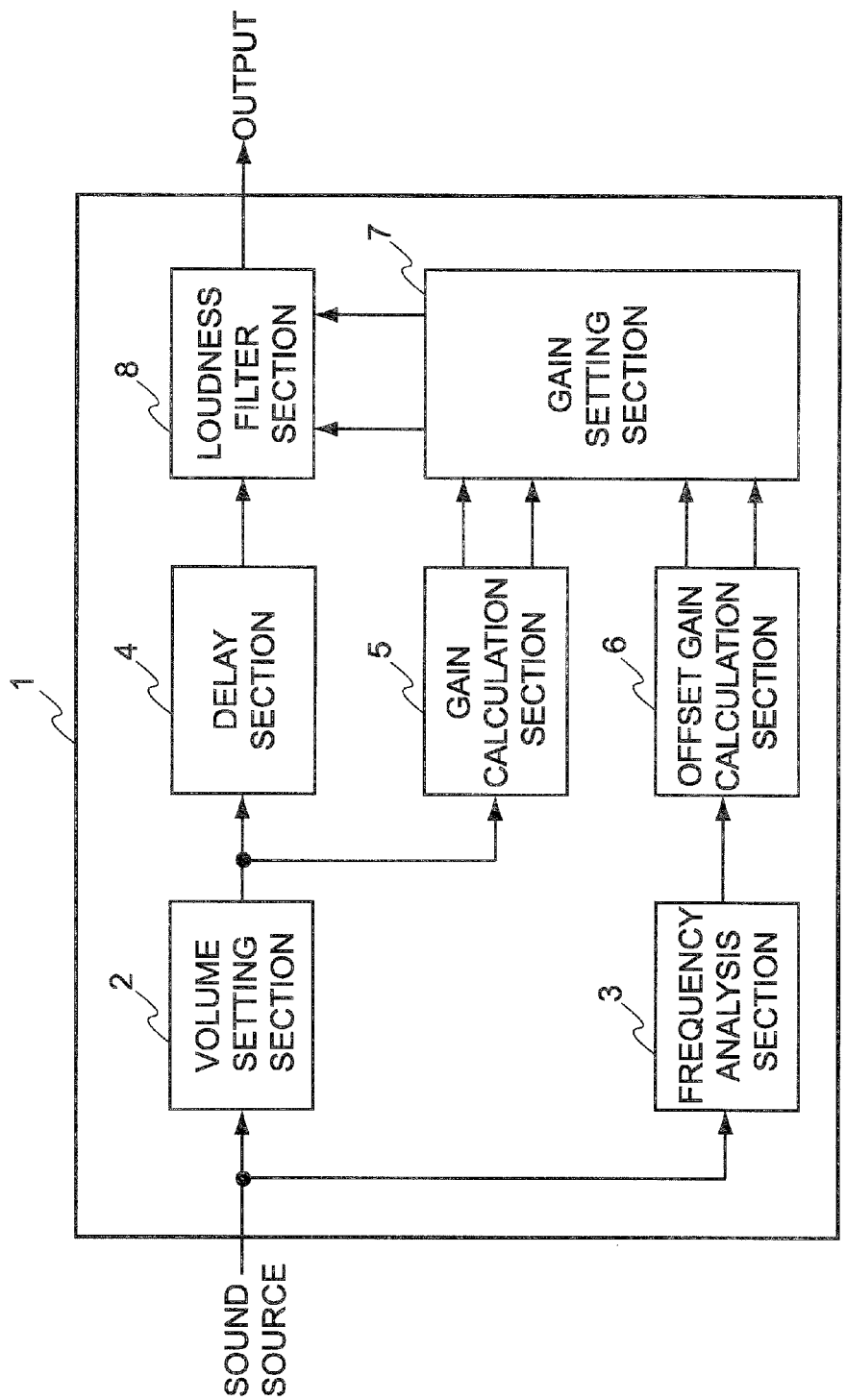
FIG. 1 is a block diagram illustrating a schematic configuration of an acoustic processing device according to an embodiment of the present invention.

FIG. 1 is a block diagram illustrating a schematic configuration of the acoustic processing device. An acoustic processing device 1 receives as an input audio signal (acoustic signal) from a not illustrated sound source. The audio signal is then subjected to predetermined acoustic processing by functional sections of the acoustic processing device 1 and output to a not illustrated output device such as a speaker to enable a listener to listen to the sound based on the audio signal.

As illustrated in FIG. 1, the acoustic processing device 1 includes a volume setting section 2, a frequency analysis section 3, a delay section 4, a gain calculation section 5, an offset gain calculation section 6, a gain setting section (acoustic signal generation section) 7, and a loudness filter section (acoustic addition section) 8.

[Volume Setting Section and Delay Section]

The volume setting section 2 serves as a controller for setting/changing the signal level of a sound source and corresponds to, e.g., a volume controller in a general audio device. The delay section 4 is provided for correcting a delay caused by acoustic processing performed in the gain calculation section 5, etc.

[Frequency Analysis Section]

As described later, the frequency analysis section 3 performs regression analysis of an audio signal whose maximum values are held. Based on a result of the regression analysis, the frequency analysis section 3 calculates frequency gradient, intercept value, and maximum value in the low-frequency signal level.

Figure 2:
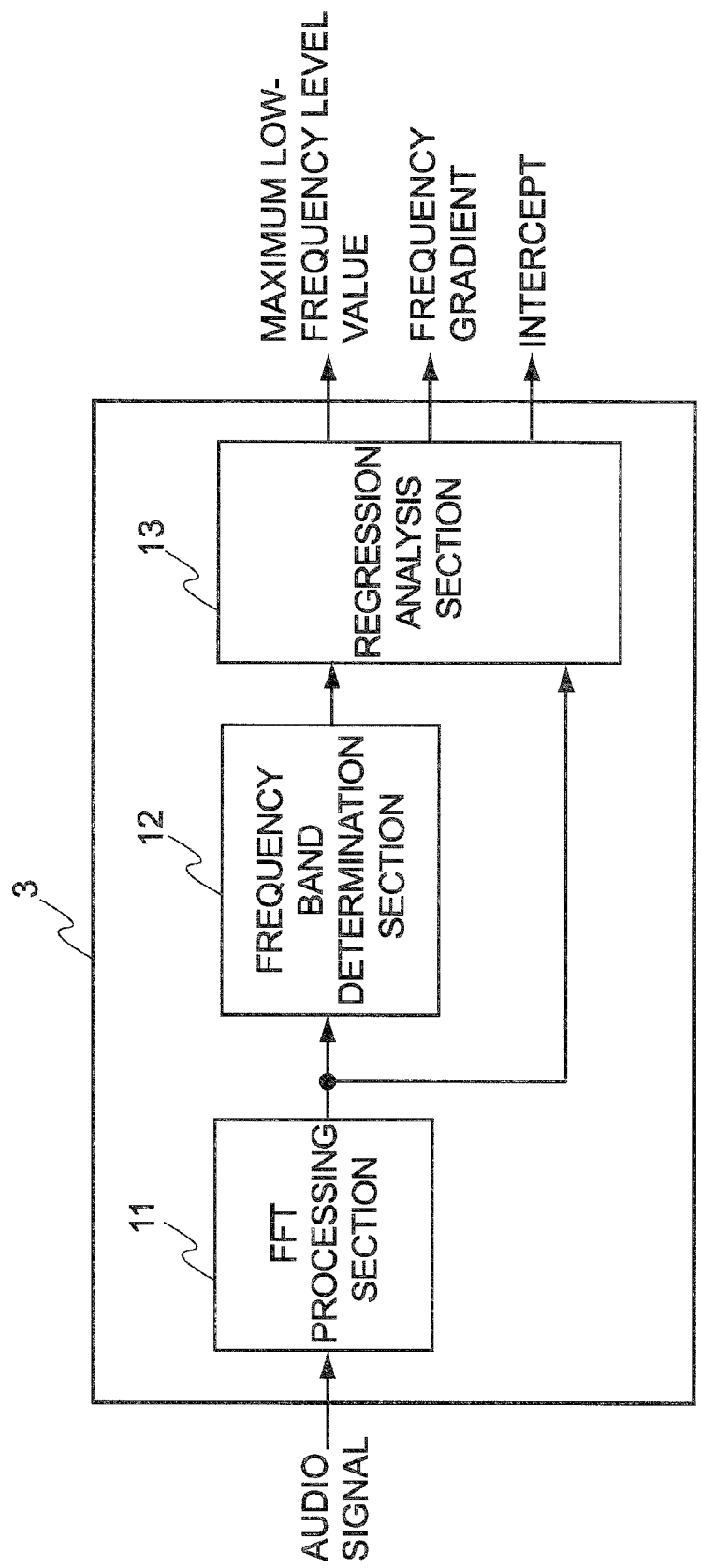
FIG. 2 is a block diagram illustrating a schematic configuration of a frequency analysis section according to the present embodiment.

As illustrated in FIG. 2, the frequency analysis section 3 includes an FFT processing section 11, a frequency band determination section 12, and a regression analysis section 13.

The FFT processing section 11 applies Fast Fourier Transform (FFT) to an audio signal input from a sound source at predetermined intervals to transform the audio signal into a signal of a frequency range. Further, the FFT processing section 11 applies averaging processing and decibel conversion to the frequency-converted audio signal. After that, the FFT processing section 11 performs holding (performs maximum value holding) of the maximum value of the signal level in the resultant audio signal for each FFT sample.

The frequency band determination section 12 determines the bandwidth of an audio signal based on a predetermined threshold. For example, setting the threshold to −80 dB allows the bandwidth capable of being listened to by ordinary listeners to be set as a processing target.

The regression analysis section 13 applies primary regression analysis to the audio signal (FFT signal) whose maximum values are held by the FFT processing section 11. The regression analysis range in the regression analysis section 13 is set between a preset frequency (e.g., 500 Hz) as the lower limit frequency and the bandwidth determined by the frequency band determination section 12 as the upper limit frequency. In the set frequency range, the regression analysis section 13 calculates a primary approximate line representing a correspondence between the audio signal level and FFT point based on the maximum value hold audio signal.

Then, based on the calculated primary approximate line, the regression analysis section 13 calculates the gradient of the frequency (primary approximate line) and intercept value (signal level value when the FFT point is 0) in the maximum value hold audio signal. Further, the regression analysis section 13 calculates the maximum signal level (hereinafter, referred to as maximum low-frequency level value) among the maximum values of the audio signal held by the FFT processing section 11 in the frequency range (FFT point lower than the FFT point corresponding to the lower limit frequency) lower than the abovementioned lower limit frequency.

Figure 3:
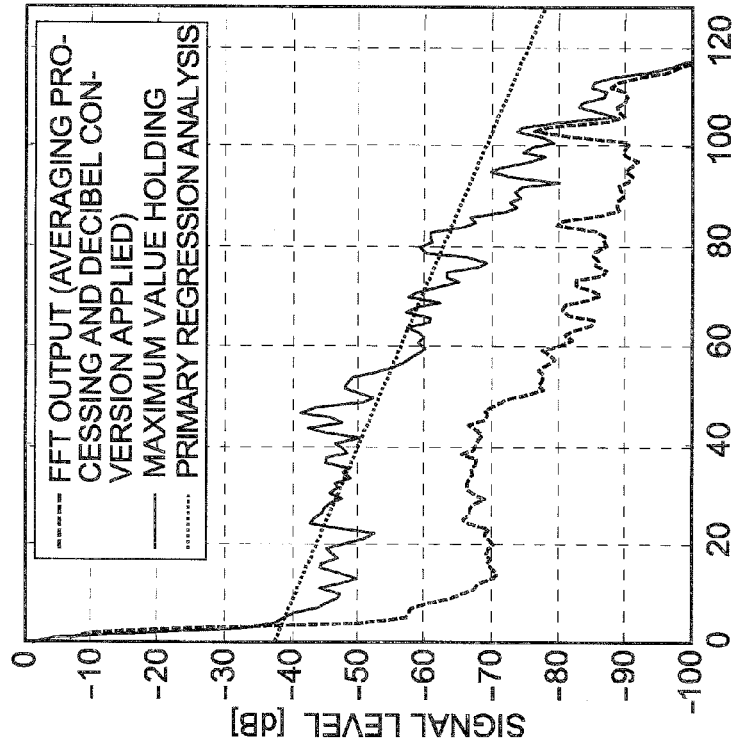
Figure 3:
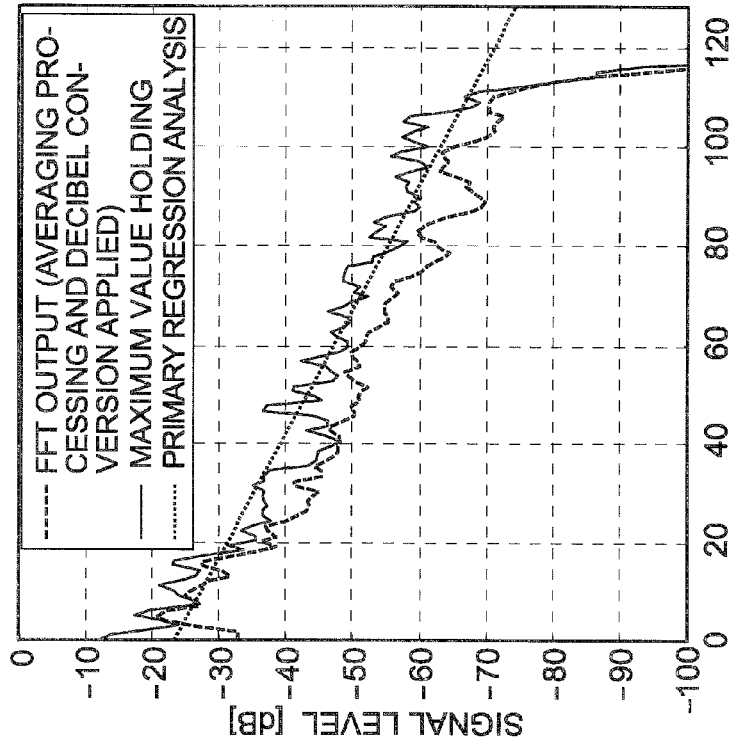
Figure 4:
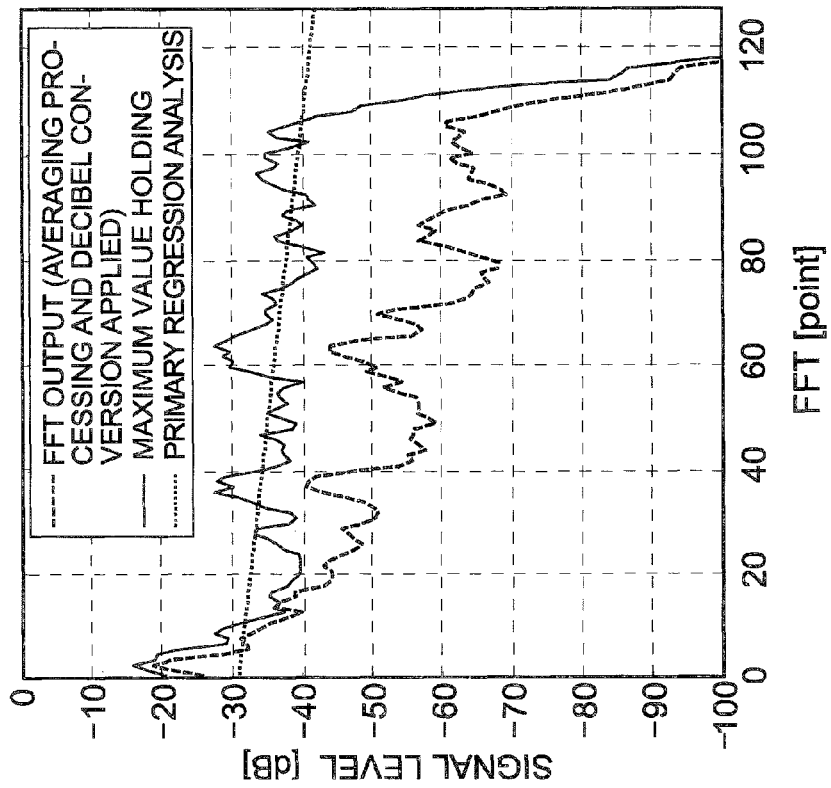
Figure 4:
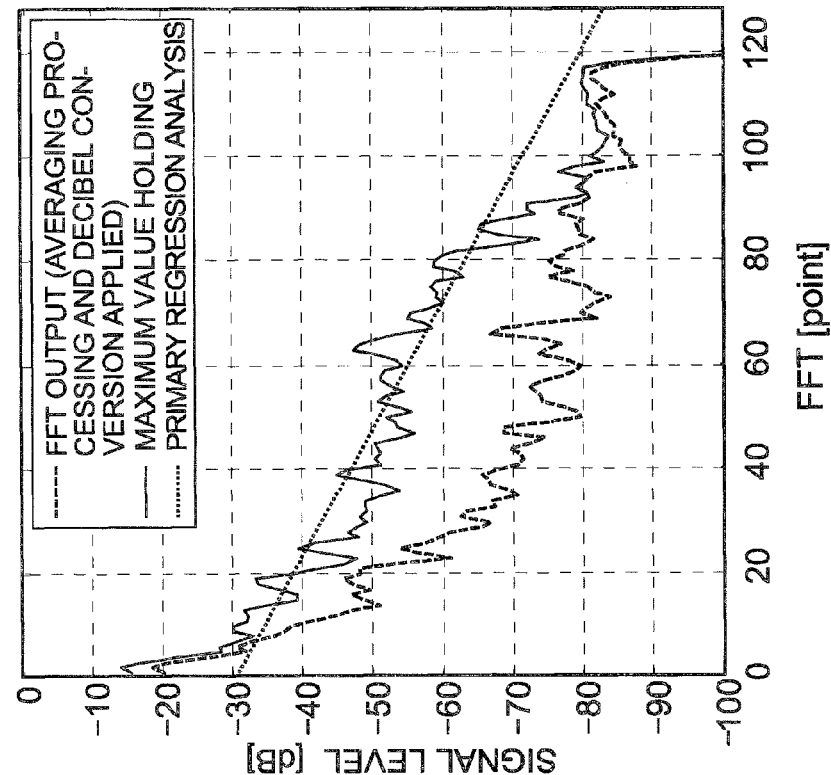

FIGS. 3(a), 3(b), 4(a), and 4(b) are views each illustrating a signal that has been subjected to the averaging processing and decibel conversion by the FFT processing section 11, a maximum value hold signal, and a primary regression analysis calculated based on the maximum value hold signal. FIG. 3(a) illustrates a state of a sound source whose low-frequency signal level is low, FIG. 3(b) illustrates a state of a sound source whose low-frequency signal level is high, FIG. 4(a) illustrates a state of a sound source whose high-frequency signal level is low, and FIG. 4(b) illustrates a state of a sound source whose high-frequency signal level is high.

In FIGS. 3(a), 3(b), 4(a), and 4(b), the FFT processing section 11 adopts 48 kHz as the sampling rate of an audio signal, 256 points (samples) as the number of FFT samples (FFT length), four frames (one frame is 128 points which is half the FFT length) as the number of averages, and a maximum of 16 frames for holding each maximum value. As the lower limit frequency in the range where the regression analysis is performed, 500 Hz (corresponding to three points in terms of FFT point) is previously set, and the regression analysis section 13 performs detection of three samples (FFT points are 0 to 3) as the maximum values of the maximum value hold signal at this frequency.

As illustrated in FIG. 5, in the case of FIG. 3(a) where the sound source whose low-frequency signal level is low, −0.41, −11, and −22 are calculated as the frequency gradient, maximum low-frequency level value, and intercept value, respectively. In the case of FIG. 3(b) where the sound source whose low-frequency signal level is high, −0.31, −1, and −37 are calculated as the frequency gradient, maximum low-frequency level value, and intercept value, respectively. In the case of FIG. 4(a) where the sound source whose high-frequency signal level is low, −0.41, −14, and −30 are calculated as the frequency gradient, maximum low-frequency level value, and intercept value, respectively. In the case of FIG. 4(b) where the sound source whose high-frequency signal level is high, −0.09, −17, and −31 are calculated as the frequency gradient, maximum low-frequency level value, and intercept value, respectively.

[Offset Gain Calculation Section]

The offset gain calculation section 6 has a role of calculating an optimum gain offset in accordance with the low-frequency signal level and high-frequency signal level of an audio signal.

Figure 6:
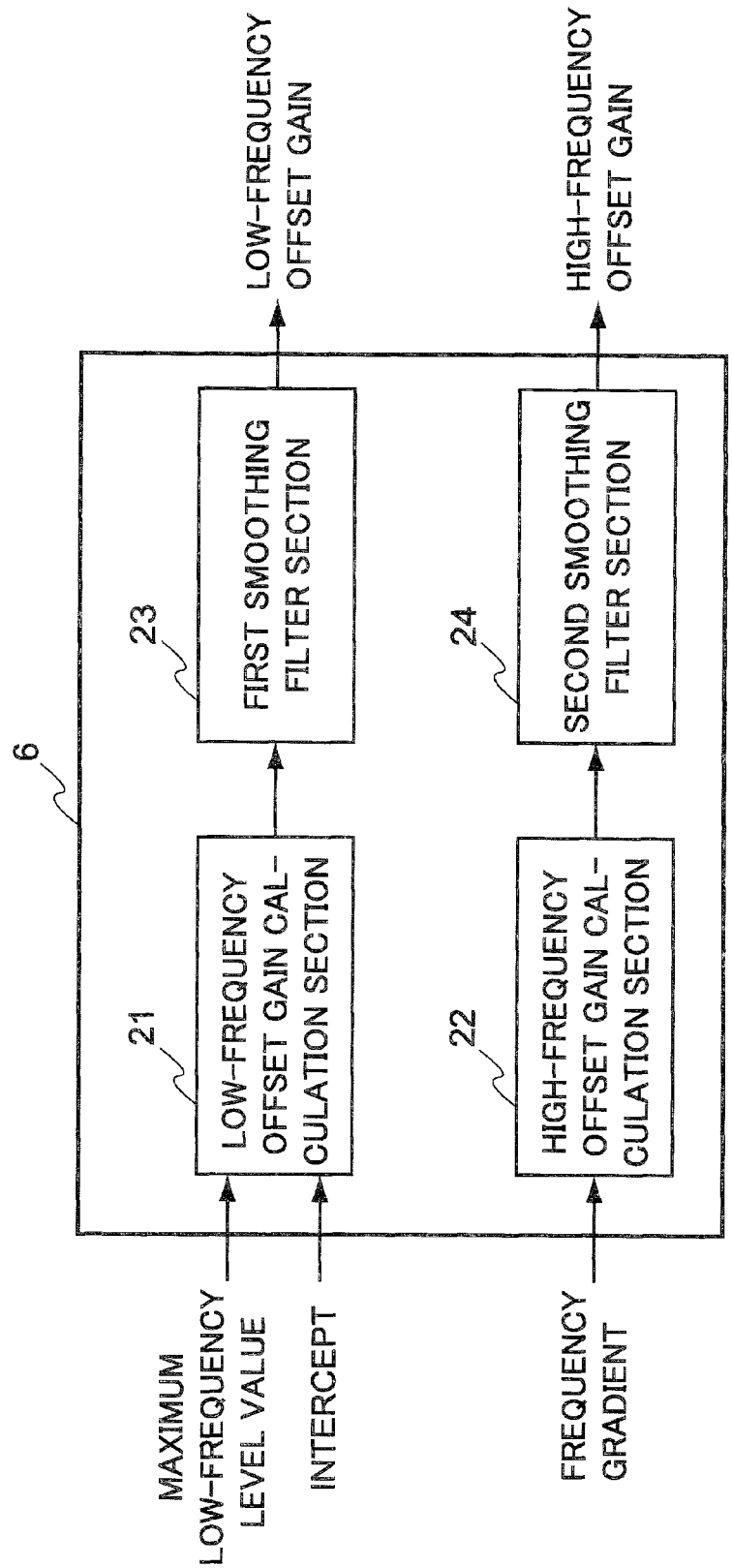
FIG. 6 is a block diagram illustrating a schematic configuration of a offset gain calculation section according to the present embodiment.

As illustrated in FIG. 6, the offset gain calculation section 6 includes a low-frequency offset gain calculation section 21, a high-frequency offset gain calculation section 22, a first smoothing filter section 23, and a second smoothing filter section 24.

The low-frequency offset gain calculation section 21 calculates a difference in the signal level between the maximum low-frequency level value and intercept value calculated by the frequency analysis section 3. The table of FIG. 5 illustrates differences concerning the sound sources of FIGS. 3(a), 3(b), 4(a), and 4(b) each of which is obtained by subtracting the intercept value from the maximum low-frequency level value. The difference values are 11, 36, 16, and 14 in the cases of FIG. 3(a), FIG. 3(b), FIG. 4(a), and FIG. 4(b), respectively.

Based on the calculated differences, the low-frequency offset gain calculation section 21 sets the gain offset in the low-frequency range.

FIG. 7(a) is a view illustrating the low-frequency gain offset set in the low-frequency offset gain calculation section 21 based on the difference. As illustrated in FIG. 7(a), as the low-frequency signal level is increased relative to all the frequencies of the audio signal with an increase of the signal level represented by the difference, the low-frequency gain offset is set lower.

By aggressively reducing the low-frequency gain offset in the case where the low-frequency signal level of a sound source has previously been increased as described above, it is possible to reduce the low-frequency signal level to be subjected to addition processing in the gain setting section 7 to be described later. On the other hand, by aggressively increasing the low-frequency gain offset in the case where the low-frequency signal level of a sound source has previously been reduced, it is possible to increase the low-frequency signal level to be subjected to addition processing in the gain setting section 7 to be described later.

However, in the case where the difference is 30 dB or more, the low-frequency gain offset is set to −6 dB, and in the case where the difference is −10 dB or less, the low-frequency gain offset is set to 6 dB. This is because that when the low-frequency gain offset is increased/reduced unlimitedly in accordance with the difference value, the low-frequency audio signal is excessively enhanced or reduced to inhibit satisfactory acoustic processing.

The high-frequency offset gain calculation section 22 sets the high-frequency gain offset based on the frequency gradient calculated by the frequency analysis section 3.

FIG. 7(b) is a view illustrating the high-frequency gain offset set in the high-frequency offset gain calculation section 22 based on the frequency gradient. As illustrated in FIG. 7(b), as the high-frequency signal level is reduced with a decrease of the frequency gradient (gradient is 0 or less), the high-frequency gain offset is set higher.

By aggressively increasing the high-frequency gain offset in the case where the high-frequency signal level of a sound source has previously been reduced as described above, it is possible to increase the high-frequency signal level to be subjected to addition processing in the gain setting section 7 to be described later. On the other hand, by aggressively reducing the high-frequency gain offset in the case where the high-frequency signal level of a sound source has previously been increased, it is possible to reduce the high-frequency signal level to be subjected to addition processing in the gain setting section 7 to be described later.

However, in the case where the gradient is 0 or more, the high-frequency gain offset is set to −6 dB, and in the case where the gradient is −1 or less, the high-frequency gain offset is set to 6 dB. This is because that when the high-frequency gain offset is increased/reduced unlimitedly in accordance with the gradient, the high-frequency audio signal is excessively enhanced or reduced to inhibit satisfactory acoustic processing.

The first smoothing filter section 23 and second smoothing filter section 24 perform filtering processing for smoothing the low-frequency gain offset and high-frequency gain offset changing in accordance with the frequency characteristics of an audio signal.

[Gain Calculation Section]

The gain calculation section 5 has a role of applying auditory sense correction to an audio signal in accordance with the auditory sense characteristics (age or taste) of a listener.

Figure 8:
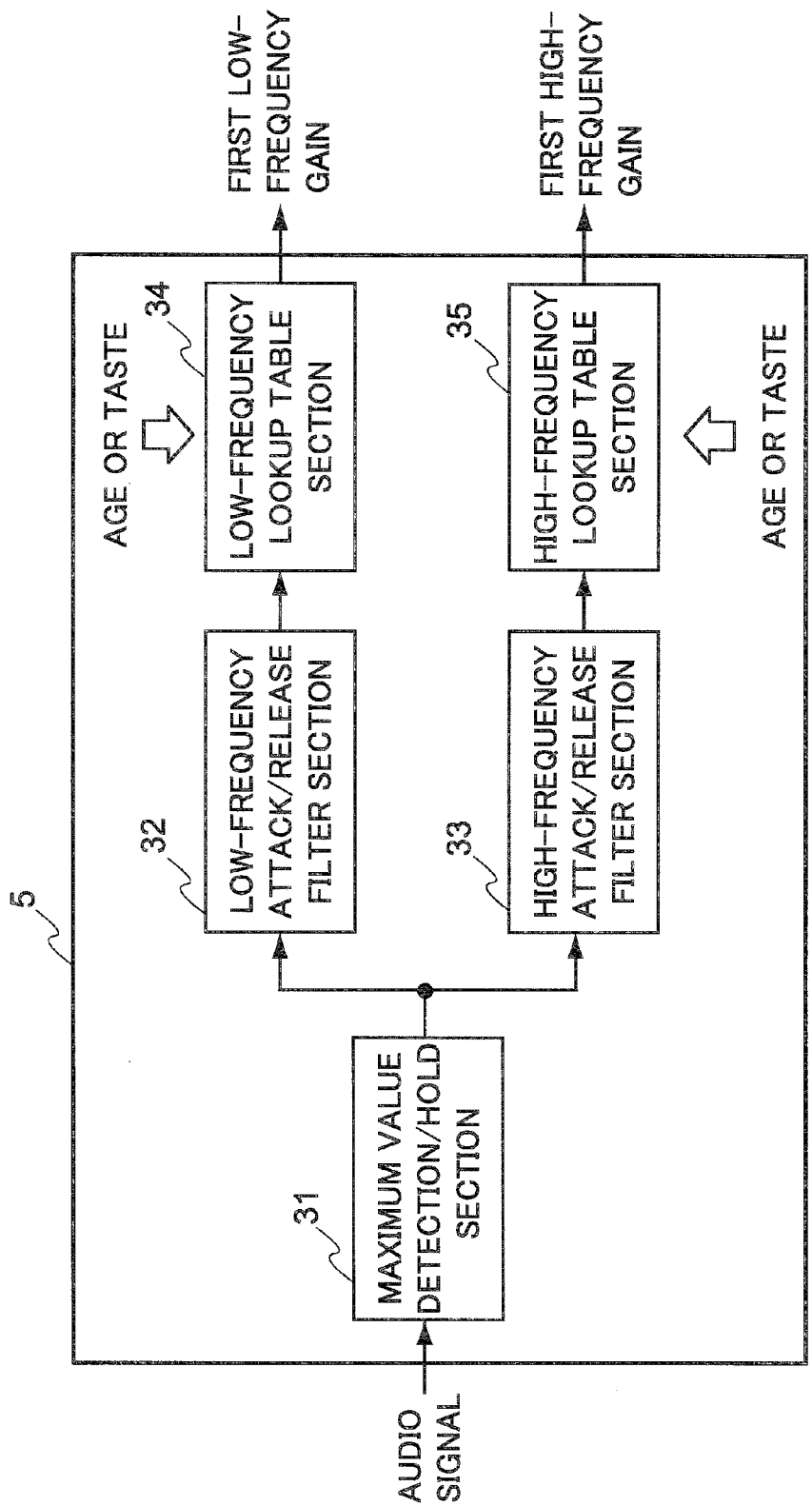
FIG. 8 is a block diagram illustrating a schematic configuration of a gain calculation section according to the present embodiment.

As illustrated in FIG. 8, the gain calculation section 5 includes a maximum value detection/hold section 31, a low-frequency attack/release filter section 32, a high-frequency attack/release filter section 33, a low-frequency lookup table section 34, and a high-frequency lookup table section 35.

The maximum value detection/hold section 31 calculates the absolute value of an audio signal input from the volume setting section 2. The calculation of the absolute value allows the audio signal whose value is changed to the positive and negative sides to be regarded as the positive value. The maximum value detection/hold section 31 detects the maximum value of the calculated absolute value at a predetermined time interval and holds the detected maximum value for a predetermined time period to allow the input audio signal to be output as a control signal.

The low-frequency attack/release filter section 32 and high-frequency attack/release filter section 33 acquire the control signal from the maximum value detection/hold section 31 and apply filtering processing to the acquired control signal so as to obtain a response speed corresponding to previously set attack time and release time to thereby smooth the control signal.

The low-frequency lookup table section 34 performs level conversion for the control signal (input signal) smoothed by the low-frequency attack/release filter section 32 by using a low-pass filter (correction amount calculation filter) to thereby set the low-frequency gain correction amount for the signal level as low-frequency auditory sense correction amount. Similarly, the high-frequency lookup table section 35 performs level conversion for the control signal smoothed by the high-frequency attack/release filter section 33 by using a high-pass filter (correction amount calculation filter) to thereby set the high-frequency gain correction amount for the signal level as high-frequency auditory sense correction amount. The low-pass filter and high-pass filter used in the low-frequency lookup table section 34 and high-frequency lookup table section 35 are each prepared in a plural number in accordance with the auditory sense characteristics so as to be arbitrarily selected in accordance with the age or taste of a listener.

Figure 9B:
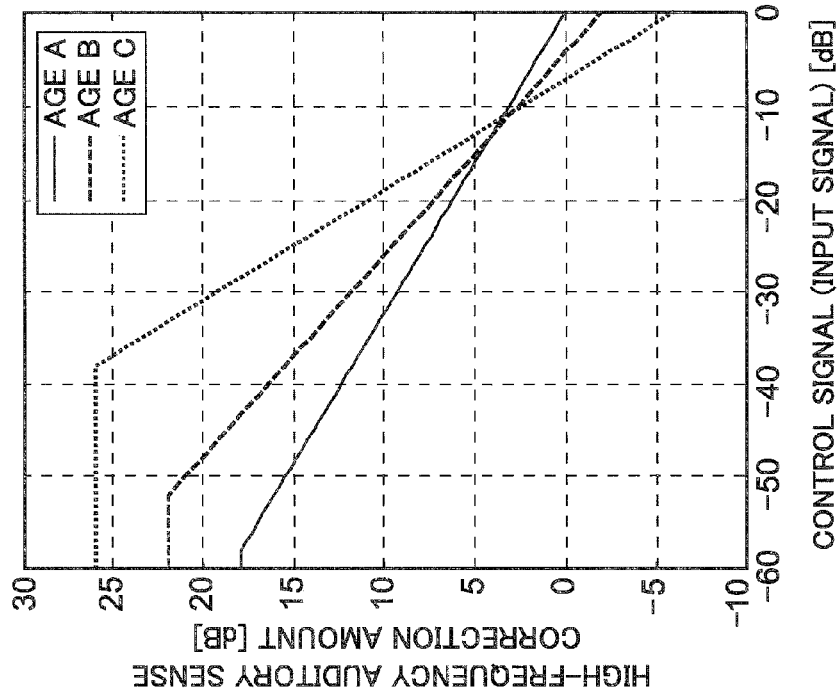
FIG. 9(b) is a view illustrating the high-frequency auditory sense correction amount calculated based on a control signal (input signal) in the high-frequency lookup table section of the gain calculation section according to the present embodiment.
Figure 9A:
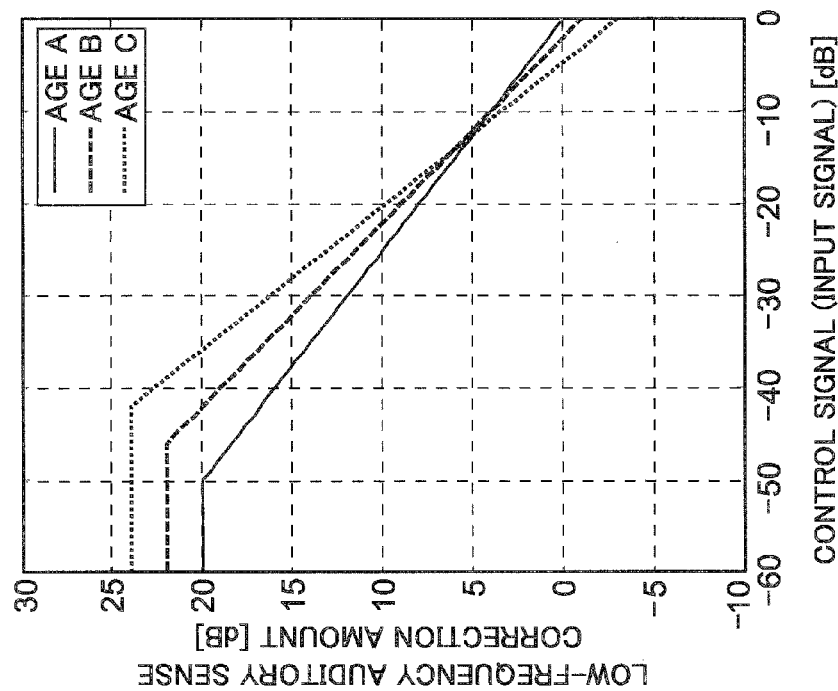
FIG. 9(a) is a view illustrating the low-frequency auditory sense correction amount calculated based on a control signal (input signal) in the low-frequency lookup table section of the gain calculation section according to the present embodiment.

FIG. 9(a) is a view illustrating the low-frequency auditory sense correction amount in the low-frequency lookup table section 34. More specifically, FIG. 9(a) illustrates correction amounts calculated by using three low-pass filters (filter for age A, filter for age B, filter for age C) corresponding to the auditory sense characteristics varying with the age of a listener.

As illustrated in FIG. 9(a), the low-frequency auditory sense correction amount in the low-frequency lookup table section 34 is increased relative to the signal level of an input signal in the order of age C>age B>age A, that is, as the age increases. Thus, the compression ratio of the low-frequency dynamic range is increased with the age. In general, ability of listening low-frequency sound diminishes with age. Therefore, when the compression ratio of the low-frequency dynamic range is increased by increasing the correction amount of the low-frequency signal level with age, the auditory sense characteristics can be enhanced.

In FIG. 9(a), the upper limit of the low-frequency auditory sense correction amount for age A is set to 20 dB, the upper limit of the low-frequency auditory sense correction amount for age B is set to 22 dB, and the upper limit of the low-frequency auditory sense correction amount for age C is set to 24 dB. Setting the upper limit as described above can prevent the low-frequency auditory sense correction amount set in accordance with the signal level from being increased unlimitedly and exceeding an adequate low-frequency auditory sense correction amount.

FIG. 9(b) is a view illustrating the high-frequency auditory sense correction amount in the high-frequency lookup table section 35. More specifically, as in the case of FIG. 9(a), FIG. 9(b) illustrates correction amounts calculated by using three high-pass filters (filter for age A, filter for age B, filter for age C).

As illustrated in FIG. 9(b), the high-frequency auditory sense correction amount in the high-frequency lookup table section 35 is increased relative to the signal level of an input signal in the order of age C>age B>age A, that is, as the age increases. Thus, the compression ratio of the high-frequency dynamic range is increased with the age. In general, ability of listening high-frequency sound diminishes with age. Therefore, when the compression ratio of the high-frequency dynamic range is increased by increasing the correction amount of the high-frequency signal level with age, the auditory sense characteristics can be enhanced.

In FIG. 9(b) the upper limit of the high-frequency auditory sense correction amount for age A is set to 18 dB, the upper limit of the high-frequency auditory sense correction amount for age B is set to 22 dB, and the upper limit of the high-frequency auditory sense correction amount for age C is set to 26 dB. Setting the upper limit as described above can prevent the high-frequency auditory sense correction amount set in accordance with the signal level from being increased unlimitedly and exceeding an adequate high-frequency auditory sense correction amount.

[Gain Setting Section]

The gain setting section 7 has a role of adding (synthesizing) the signal that has been subjected to the auditory sense correction by the gain calculation section 5 and signal that has been subjected to the low-frequency and high-frequency offset gain processing by the offset gain calculation section 6.

Figure 10:
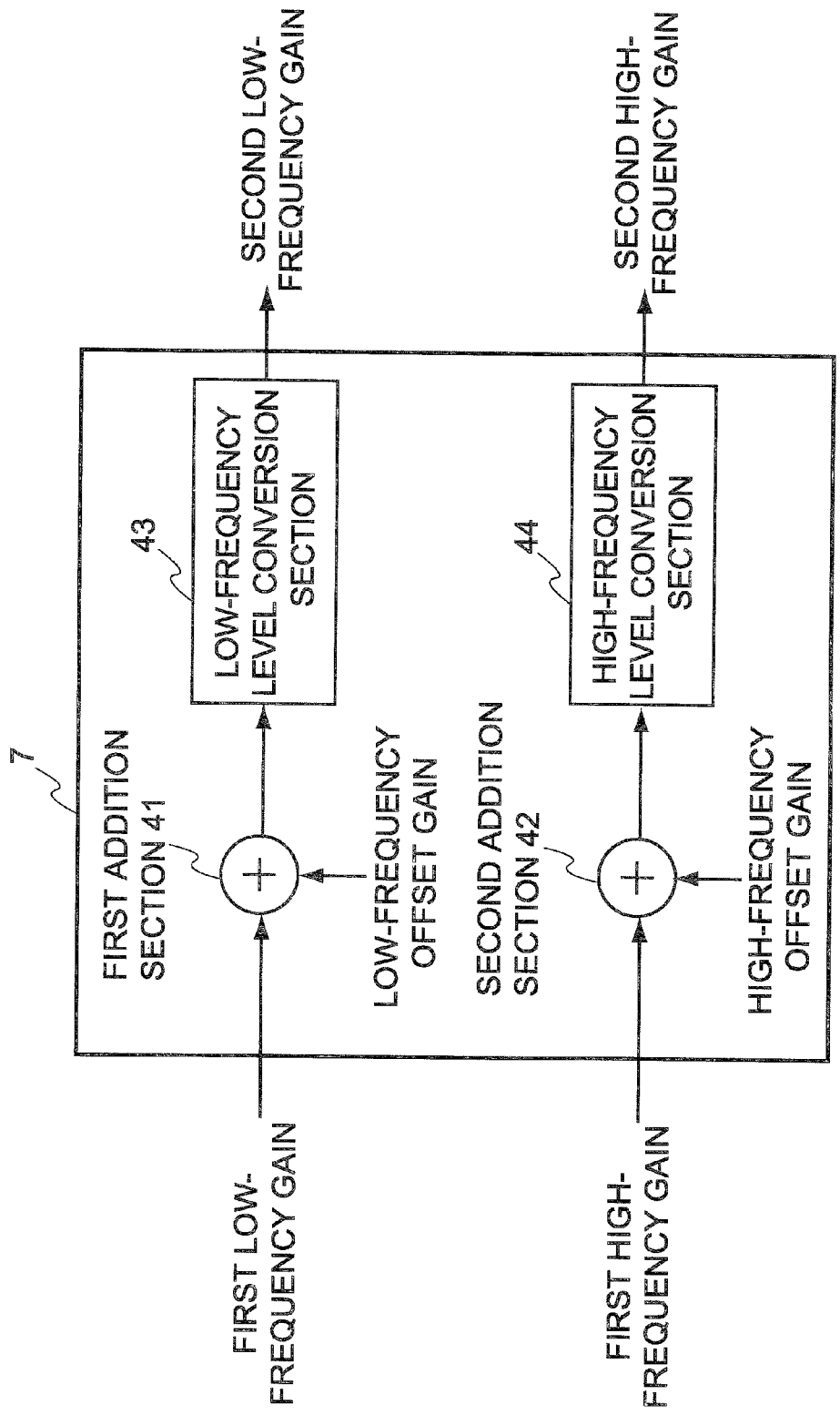
FIG. 10 is a block diagram illustrating a schematic configuration of a gain setting section according to the present embodiment.

As illustrated in FIG. 10, the gain setting section 7 includes a first addition section 41, a second addition section 42, a low-frequency level conversion section 43, and a high-frequency level conversion section 44.

The first addition section 41 adds a first low-frequency gain in which the low-frequency auditory sense correction amount has been set by the low-frequency lookup table section 34 of the gain calculation section 5 and low-frequency offset gain that has been subjected to the filtering processing by the first smoothing filter section 23 of the offset gain calculation section 6. This addition processing allows generation of a low-frequency control signal (acoustic signal) set based on the frequency characteristics of the audio signal of a sound source and auditory sense characteristics. The control signal obtained by the addition processing in the first addition section 41 is output to the low-frequency level conversion section 43.

The second addition section 42 adds a first high-frequency gain in which the high-frequency auditory sense correction amount has been set by the high-frequency lookup table section 35 of the gain calculation section 5 and high-frequency offset gain that has been subjected to the filtering processing by the second smoothing filter section 24 of the offset gain calculation section 6. This addition processing allows generation of a high-frequency control signal (acoustic signal) set based on the auditory sense characteristics and frequency characteristics of the audio signal of a sound source. The control signal obtained by the addition processing in the second addition section 42 is output to the high-frequency level conversion section 44.

The low-frequency level conversion section 43 has a role of performing adjustment such that the low-frequency gain becomes a predetermined gain corresponding to the configuration of the loudness filter section 8. The low-frequency level conversion section 43 performs decibel-to-linear conversion and two-division processing for the control signal input from the first addition section 41 and, after that, outputs the resultant control signal to the loudness filter section 8 as a second low-frequency gain.

The high-frequency level conversion section 44 has a role of performing adjustment such that the high-frequency gain becomes a predetermined gain corresponding to the configuration of the loudness filter section 8. The high-frequency level conversion section 44 performs decibel-to-linear conversion and two-division processing for the control signal input from the second addition section 42 and, after that, outputs the resultant control signal to the loudness filter section 8 as a second high-frequency gain.

[Loudness Filter Section]

The loudness filter section 8 has a role of performing correction for (adds acoustic effect to) the low-frequency and high-frequency ranges of the audio signal of a sound source in accordance with the frequency characteristics of the audio signal and auditory sense characteristics of a listener.

Figure 11:
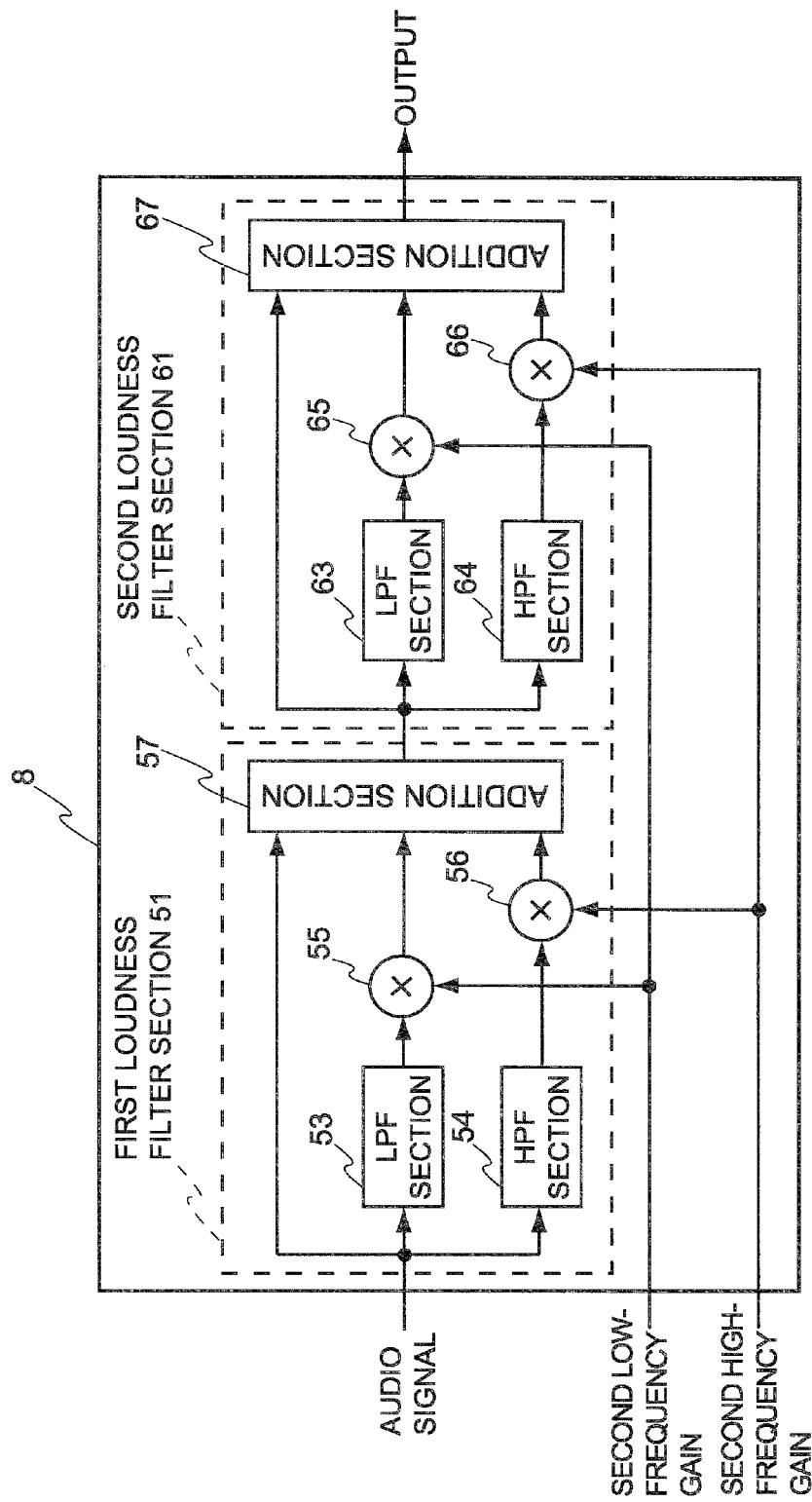
FIG. 11 is a block diagram illustrating a schematic configuration of a loudness filter section according to the present embodiment.

As illustrated in FIG. 11, the loudness filter section 8 includes cascade-connected first and second loudness filter sections 51 and 61. The loudness filter sections 51 and 61 include LPF sections 53, 63, HPF sections 54, 64, first multiplication sections 55, 65, second multiplication sections 56, 66, and addition sections 57, 67, respectively.

The audio signal input to the first loudness filter section 51 through the delay section 4 is divided on a frequency band basis by the LPF section 53 and HPF section 54. The LPF section 53 is a primary IIR (Infinite Impulse Response) filter type low-pass filter and has a function of transmitting therethrough only a low-frequency audio signal to the first multiplication section 55. The HPF section 54 is a primary IIR filter type high-pass filter and has a function of transmitting therethrough only a high-frequency audio signal to the second multiplication section 56.

The audio signal guided to the first multiplication section 55 by the LPF section 53 is multiplied by the second low-frequency gain input from the gain setting section 7 in the first multiplication section 55 and then output to the addition section 57. This multiplication processing allows application of the auditory sense correction processing and offset gain processing to the low-frequency portion of the audio signal input from a sound source.

The audio signal guided to the second multiplication section 56 by the HPF section 54 is multiplied by the second high-frequency gain input from the gain setting section 7 in the second multiplication section 56 and then output to the addition section 57. This multiplication processing allows application of the auditory sense correction processing and offset gain processing to the high-frequency portion of the audio signal input from a sound source.

The addition section 57 adds the low-frequency and high-frequency audio signals that have been subjected to the auditory sense correction processing and offset gain processing and audio signal in the entire frequency range. Further, the same processing as above are applied by the LPF section 63, HPF section 64, first multiplication section 65, second multiplication section 66, and addition section 67 of the second loudness filter section 61 to the audio signal that has been subjected to the addition processing. After that, the resultant audio signal is output to a not illustrated output device such as a speaker.

As described above, the loudness filter section 8 is constituted by the cascade-connected first and second loudness filter sections 51 and 61. In the first loudness filter section 51, correction processing is applied to a signal in which the low and high-frequency ranges thereof have been corrected in accordance with the frequency characteristics of the audio signal and auditory sense characteristics of a listener. Further, the same correction processing is applied to the resultant audio signal in the second loudness filter section 61. Thus, it is possible to effectively apply the correction processing to the audio signal to be output to the output section.

FIGS. 12(a), 12(b), 13(a), and 13(b) illustrate the characteristics of the loudness filter section 8 in the case where the filter type (target age) used in the auditory sense correction processing in the gain calculation section 5 and offset gain value set in the offset gain calculation section 6 are set to different values. In the examples of FIGS. 12(a), 12(b), 13(a), and 13(b), the cutoff frequencies of the LPF sections 53 and 63 in the loudness filter section 8 are set to 80 Hz, and cutoff frequencies of the HPF sections 54 and 64 are set to 13 kHz.

Figure 12:
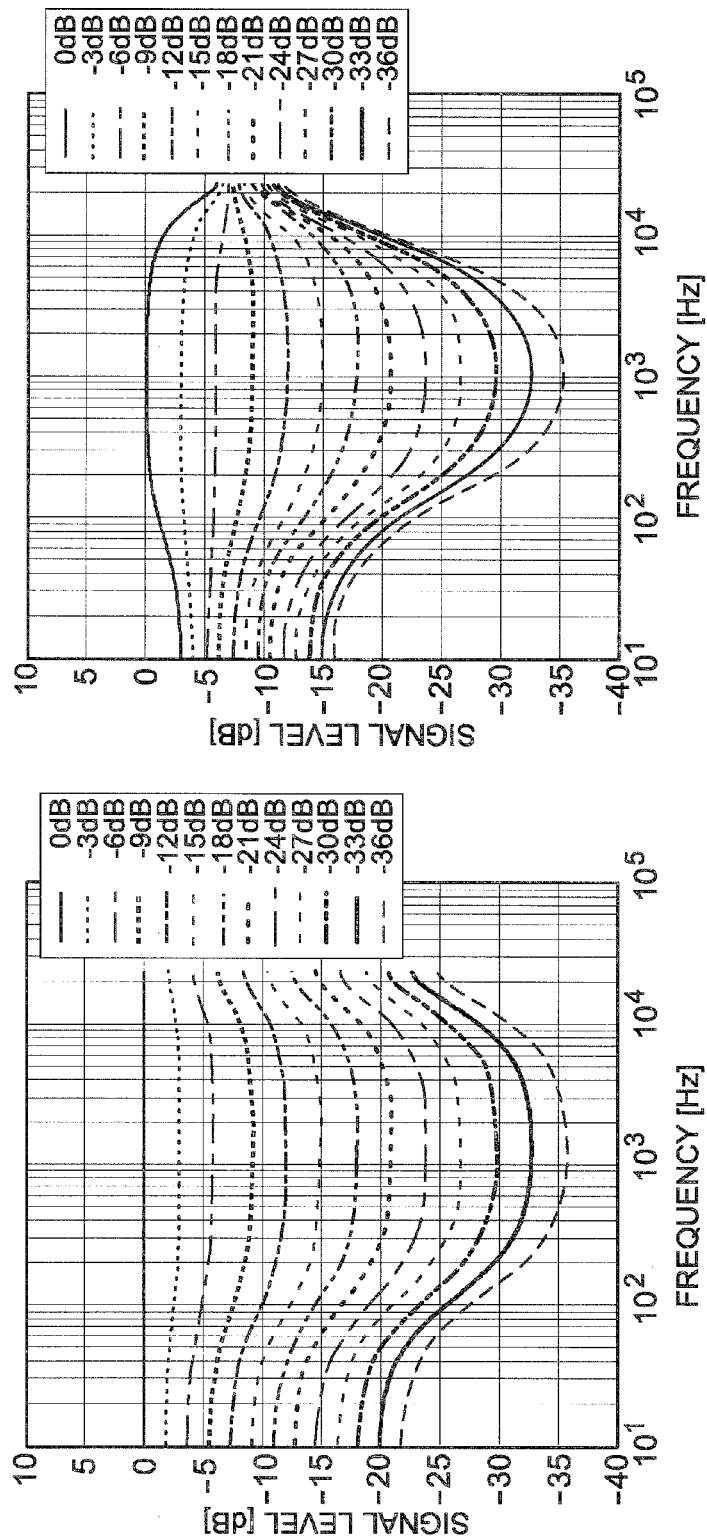
FIG. 12 is a view illustrating the characteristics of the loudness filter section according to the present embodiment in accordance with the gain offset set in the offset gain calculation section and filter type used in the gain calculation section.

FIG. 12(a) illustrates the characteristics of the loudness filter section 8 in the case where the auditory sense correction is performed by the gain calculation section 5 under the condition where the low-frequency gain offset and high-frequency gain offset set in the offset gain calculation section 6 are both 0 dB and the filters for age A are used as the low-pass filter and high-pass filter. FIG. 12(b) illustrates the characteristics of the loudness filter section 8 in the case where the auditory sense correction is performed by the gain calculation section 5 under the condition where the low-frequency gain offset and high-frequency gain offset set in the offset gain calculation section 6 are both 0 dB and the filters for age C are used as the low-pass filter and high-pass filter.

The low-frequency dynamic range and high-frequency dynamic range are compressed more in the characteristics of the loudness filter section 8 illustrated in FIG. 12(b) than the characteristics of the loudness filter section 8 illustrated in FIG. 12(a). Thus, in the case where the input signal level of the audio signal is high, that is, in the case where the volume level is high, low-frequency signal level and high-frequency signal level can be suppressed more in the filter characteristics of FIG. 12(b) than in the filter characteristics of FIG. 12(a). Further, in the case where the volume level is low, low-frequency signal level and high-frequency signal level can be amplified more in the filter characteristics of FIG. 12(b) than in the filter characteristics of FIG. 12(a).

As described above, by adequately setting the filter for the auditory sense correction using the acoustic processing device 1 of the present invention for audio signal reproduction processing, even in the case where a listener having reduced auditory sensitivity for high-frequency and low-frequency regions listens to music in which low-frequency volume level and high-frequency volume level are significantly enhanced or reduced, it is possible to correct (acoustic processing) the signal level of a sound source to an adequate level to thereby prevent a listener from feeling uncomfortable with music.

FIG. 13(a) illustrates the characteristics of the loudness filter section 8 in the case where the auditory sense correction is performed by the gain calculation section 5 under the condition where the low-frequency gain offset and high-frequency gain offset set in the offset gain calculation section 6 are both −6 dB and the filters for age A are used as the low-pass filter and high-pass filter. FIG. 13(b) illustrates the characteristics of the loudness filter section 8 in the case where the auditory sense correction is performed by the gain calculation section 5 under the condition where the low-frequency gain offset and high-frequency gain offset set in the offset gain calculation section 6 are −3 dB and 6 dB, respectively and the filters for age A are used as the low-pass filter and high-pass filter.

As illustrated in FIGS. 13(a) and 13(b), in the case where the auditory sense correction is performed using the same filter (filter for A), the frequency characteristics dynamically change in accordance with the gain offset. As described above, the gain offset is adequately set in accordance with the difference between the maximum low-frequency level value and intercept value, that is, low-frequency signal level. Further, in the high-frequency range, the gain offset is adequately set based on the frequency gradient. Thus, even in the case where the low-frequency or high-frequency range is previously enhanced or reduced depending on the category of a sound source or frequency characteristics in the audio signal, it is possible to correct the low-frequency and high-frequency ranges to an adequate level. Therefore, a problem that the low-frequency and high-frequency ranges are excessively enhanced to make music hard to listen to in terms of auditory sense or distortion sound is generated from a speaker can be suppressed.

As described above, according to the acoustic processing device 1 of the present embodiment, in the case where the low-frequency signal level of an audio signal is higher relative to all the frequencies, the offset gain calculation section 6 reduces the low-frequency gain offset to reduce the low-frequency signal level. Further, in the case where the low-frequency signal level of an audio signal is lower relative to all the frequencies, the offset gain calculation section 6 increases the low-frequency gain offset to increase the low-frequency signal level. Thus, even in the case where the low-frequency range of an audio signal is previously enhanced or reduced depending on the category of music or characteristics thereof, it is possible to correct the low-frequency signal level to an optimum level.

Further, according to the acoustic processing device 1 of the present embodiment, in the case where the high-frequency signal level of an audio signal is high, the offset gain calculation section 6 reduces the high-frequency gain offset to reduce the high-frequency signal level. Further, in the case where the high-frequency signal level of an audio signal is low, the offset gain calculation section 6 increases the high-frequency gain offset to increase the high-frequency signal level. Thus, even in the case where the high-frequency range is previously enhanced or reduced depending on the category of music or characteristics thereof, it is possible to correct the high-frequency signal level to an optimum level.

Further, according to the acoustic processing device 1 of the present embodiment, the gain calculation section 5 can perform the auditory sense correction by changing the low-pass filter used in the low-frequency lookup table section 34 or high-pass filter used in the high-frequency lookup table section 35 depending on the age or taste of a listener. Thus, it is possible to correct the compression ratio of the low-frequency or high-frequency dynamic range so as to compensate for the audibility that diminishes with age or depending on the taste of a listener.

Therefore, according to the acoustic processing device 1 of the present embodiment, the offset gain calculation section 6 performs correction for the high-frequency and low-frequency ranges based on the frequency characteristics of an audio signal and gain calculation section 5 performs correction for the high-frequency and low-frequency ranges based on the auditory sense characteristics of a listener, whereby the low-frequency and high-frequency signal levels of an audio signal can be adjusted to optimum levels, allowing the audio signal to be reproduced with satisfactory sound quality in terms of auditory sense.

Although the present invention has been shown and described with reference to the accompanying drawings, the acoustic processing device of the present invention is not limited to the above embodiment. It will be apparent to those having ordinary skill in the art that a number of modifications or alternations to the invention as described herein may be made, none of which depart from the spirit of the present invention. All such modifications and alternations should therefore be seen as within the scope of the present invention.

For example, in the embodiment described above, the low-frequency lookup table section 34 and high-frequency lookup table section 35 each adopt, as filters for auditory sense correction, a plurality of filters classified by age. However, the filters used in the low-frequency lookup table section 34 and high-frequency lookup table section 35 need not be prepared on the basis of age, but may be set/changed depending on the taste of a listener.

Further, in the embodiment described above, the two filter sections 51 and 61 in the loudness filter section 8 are cascade-connected to each other. However, the configuration of the loudness filter section is not limited to this, but the loudness filter section may include only one filter section or three or more filter sections connected to one another.

REFERENCE SINGS LIST 1 acoustic processing device
2 volume setting section
3 frequency analysis section
4 delay section
5 gain calculation section
6 offset gain calculation section
7 gain setting section (acoustic signal generation section)
8 loudness filter section (acoustic addition section)

11 FFT processing section (of frequency analysis section)
12 frequency band determination section (of frequency analysis section)
13 regression analysis section (of frequency analysis section)
21 low-frequency offset gain calculation section (of offset gain calculation section)
22 high-frequency offset gain calculation section (of offset gain calculation section)
23 first smoothing filter section (of offset gain calculation section)
24 second smoothing filter section (of offset gain calculation section)
31 maximum value detection/hold section (of gain calculation section)
32 low-frequency attack/release filter section (of gain calculation section)
33 high-frequency attack/release filter section (of gain calculation section)
34 low-frequency lookup table section (of gain calculation section)
35 high-frequency lookup table section (of gain calculation section)
41 first addition section (of gain setting section)
42 second addition section (of gain setting section)
43 low-frequency level conversion section (of gain setting section)
44 high-frequency level conversion section (of gain setting section)
51 first loudness filter section (of loudness filter section)
53 LPF section (of first loudness filter section)
54 HPF section (of first loudness filter section)
55 first multiplication section (of first loudness filter section)
56 second multiplication section (of first loudness filter section)
57 addition section (of first loudness filter section)
61 second loudness filter section (of loudness filter section)
63 LPF section (of second loudness filter section)
64 LPF section (of second loudness filter section)
65 first multiplication section (of second loudness filter section)
66 second multiplication section (of second loudness filter section)
67 addition section (of second loudness filter section)

The invention claimed is:

1. An acoustic processing device capable of applying acoustic processing matching listener's sense to reproduce an audio signal with satisfactory sound quality in terms of auditory sense irrespective of characteristics of a sound source, said acoustic processing device comprising:
a gain calculation section that calculates a gain correction amount corresponding to predetermined auditory sense characteristics based on a signal level of the audio signal from the sound source;
a frequency analysis section that analyzes a frequency of the audio signal;
an offset gain calculation section that calculates a gain offset for the audio signal based on the frequency characteristics of the audio signal analyzed by the frequency analysis section;
an acoustic signal generation section that generates an acoustic signal to be added to the audio signal based on the gain correction amount calculated by the gain calculation section and gain offset calculated by the offset gain calculation section; and
an acoustic addition section that adds the acoustic signal generated by the acoustic signal generation section to the audio signal,
wherein the offset gain calculation section calculates the grain offset based on a difference in the signal level of the audio signal between a maximum frequency level value and an intercept value, where the intercept value is a signal level value at which a Fast Fourier Transform point is zero.

2. The acoustic processing device according to claim 1, wherein
the gain calculation section divides the frequency of the audio signal into a plurality of frequency bands and calculates the gain correction amount for each of the frequency bands,
the offset gain calculation section calculates the gain offset for each of the frequency bands obtained by the frequency division in the gain calculation section,
the acoustic signal generation section generates the acoustic signal to be added to the audio signal for each of the frequency bands based on the frequency-based gain correction amount calculated by the gain calculation section and frequency-based gain offset calculated by the offset gain calculation section, and
the acoustic addition section adds the frequency-based acoustic signal generated by the acoustic signal generation section to the audio signal of the corresponding frequency.

3. The acoustic processing device according to claim 2, wherein
the frequency analysis section calculates a signal level state for each of the frequency bands obtained by the frequency division based on a change in the signal level in the frequency range of the audio signal, and
the offset gain calculation section calculates the gain offset of the audio signal for each of the frequency bands based on the frequency-based signal level state calculated by the frequency analysis section.

4. The acoustic processing device according to claim 3, wherein
in the case where the frequency analysis section determines that the signal level of the audio signal in a predetermined frequency range is higher relative to all the frequencies of the audio signal, the offset gain calculation section calculates a gain offset capable of reducing the signal level in the predetermined frequency range.

5. The acoustic processing device according to claim 3, wherein
in the case where the frequency analysis section determines that the signal level of the audio signal in a predetermined frequency range is lower relative to all the frequencies of the audio signal, the offset gain calculation section calculates a gain offset capable of increasing the signal level in the predetermined frequency range.

6. The acoustic processing device according to claim 1, wherein
in the case where the signal level of the audio signal is high, the gain calculation section calculates the gain correction amount capable of reducing the signal level of the audio signal, and
in the case where the signal level of the audio signal is low, the gain calculation section calculates the gain correction amount capable of increasing the signal level of the audio signal.

7. The acoustic processing device according to claim 1, wherein
the gain calculation section has a plurality of correction amount calculation filters for use in the calculation of the gain correction amount and calculates the correction amount based on one of the plurality of correction amount calculation filters selected by a listener.

8. The acoustic processing device according to claim 7, wherein
the plurality of correction amount calculation filters include a plurality of calculation filters in which an audible signal level is changed in a stepwise manner in consideration of the audibility of a listener that diminishes with age.

9. The acoustic processing device according to claim 1, wherein
the gain calculation section calculates the gain correction amount corresponding to the predetermined auditory sense characteristics based on the signal level of the audio signal from the sound source based on a listener's age.

10. An acoustic processing device capable of applying acoustic processing matching listener's sense to reproduce an audio signal with satisfactory sound quality in terms of auditory sense irrespective of characteristics of a sound source, said acoustic processing device comprising:

a gain calculation section that calculates a gain correction amount corresponding to predetermined auditory sense characteristics based on a signal level of the audio signal from the sound source;

a frequency analysis section that analyzes a frequency of the audio signal;

an offset gain calculation section that sets a gain offset for the audio signal based on a frequency gradient calculated by the frequency analysis section;

an acoustic signal generation section that generates an acoustic signal to be added to the audio signal based on the gain correction amount calculated by the gain calculation section and gain offset calculated by the offset gain calculation section; and an acoustic addition section that adds the acoustic signal generated by the acoustic signal generation section to the audio signal, wherein the offset Pain calculation section calculates the gain offset based on a difference in the signal level of the audio signal between a maximum frequency level value and an intercept value, where the intercept value is a signal level value at which a Fast Fourier Transform point is zero.

* * * * *